United States Patent
Ozawa

(10) Patent No.: US 9,835,655 B2
(45) Date of Patent: Dec. 5, 2017

(54) OUTPUT CURRENT MONITORING CIRCUIT

(71) Applicant: Dialog Semiconductor GmbH, Kirchheim/Teck-Nabern (DE)

(72) Inventor: Seiichi Ozawa, Wakoh (JP)

(73) Assignee: Dialog Semiconductor (UK) Limited, Reading (GB)

( * ) Notice: Subject to any disclaimer, the term of this patent is extended or adjusted under 35 U.S.C. 154(b) by 465 days.

(21) Appl. No.: 14/308,789

(22) Filed: Jun. 19, 2014

(65) Prior Publication Data

US 2015/0355242 A1 Dec. 10, 2015

(30) Foreign Application Priority Data

Jun. 6, 2014 (EP) .................................... 14368026

(51) Int. Cl.
*G01R 19/00* (2006.01)
*H02M 3/158* (2006.01)
*H02M 1/00* (2006.01)

(52) U.S. Cl.
CPC ...... *G01R 19/0092* (2013.01); *H02M 3/1582* (2013.01); *H02M 3/158* (2013.01); *H02M 2001/0009* (2013.01)

(58) Field of Classification Search
CPC ....... G01R 19/00; G01R 19/0092; G06F 1/26; H02M 2001/0009; H02M 3/156; H02M 3/1582; H02M 3/1584; H02M 3/155; H02M 3/158; H02M 3/1588; H04B 2215/069; G05F 1/5735; G05F 1/573
USPC ............. 324/123 R, 76.1, 157; 323/282–290
See application file for complete search history.

(56) References Cited

U.S. PATENT DOCUMENTS

| | | | |
|---|---|---|---|
| 6,765,372 B2 * | 7/2004 | Isham | G01R 31/40 323/224 |
| 6,946,828 B1 | 9/2005 | Layton | |
| 7,102,337 B2 * | 9/2006 | Wheeler | H02M 3/1588 323/224 |
| 7,301,288 B2 | 11/2007 | Green | |
| 7,772,818 B2 * | 8/2010 | Smith | G01R 19/003 323/282 |
| 7,986,188 B2 | 7/2011 | Fujiwara | |

(Continued)

OTHER PUBLICATIONS

Wong et al. "A Low Noise Buck Converter with a Fully Integrated Continuous Time ΣΔ Modulated Feedback Controller," IEEE 2007 Custom Integrated Circuits Conference (CICC), p. 337-380 (Wong).*

(Continued)

*Primary Examiner* — Tung X Nguyen
*Assistant Examiner* — Lee Rodak
(74) *Attorney, Agent, or Firm* — Saile Ackerman LLC; Stephen B. Ackerman

(57) ABSTRACT

A current monitoring circuit capable of being integrated onto an integrated circuit chip with the current source to be monitored, wherein the monitored current is digitized to be transmitted within and external to the host integrated circuit chip. The current monitoring circuit was originally conceived to monitor output current of a buck switching regulator but can be used in other applications. A replica transistor is drain connected to a replicated transistor, wherein an operational transconductor controls the replica transistor to produce the same current that flows in the replicated transistor and connects a copy of the current of the replicated transistor current to an integrating type ADC.

24 Claims, 3 Drawing Sheets

(56) References Cited

U.S. PATENT DOCUMENTS

| | | |
|---|---|---|
| 8,026,636 B2 | 9/2011 | Oh |
| 8,612,779 B2 | 12/2013 | More et al. |
| 8,627,119 B2 | 1/2014 | Barnes et al. |
| 2003/0128485 A1 | 7/2003 | Matsumoto |
| 2005/0189973 A1 | 9/2005 | Li |
| 2005/0219926 A1* | 10/2005 | Tai ............... H02M 3/1588 365/207 |
| 2010/0052637 A1* | 3/2010 | Lorentz ........... G01R 19/0092 323/282 |
| 2010/0164553 A1* | 7/2010 | Ha ................... H02M 3/156 327/103 |
| 2011/0057645 A1* | 3/2011 | Jager ................. B60T 8/36 324/125 |
| 2011/0291871 A1* | 12/2011 | Lin ..................... H03M 1/52 341/155 |
| 2013/0057241 A1* | 3/2013 | Shuvalov ........... H03K 17/122 323/271 |
| 2013/0214950 A1* | 8/2013 | Hojabri ............. H03M 3/458 341/143 |
| 2013/0271216 A1 | 10/2013 | Liu et al. |
| 2013/0314062 A1 | 11/2013 | Notman et al. |
| 2014/0015507 A1 | 1/2014 | Park et al. |
| 2014/0253089 A1* | 9/2014 | Qin ................... H02M 3/158 323/316 |

OTHER PUBLICATIONS

Saggini et al. "Efficiency Estimation in Digitally-Controlled dc-dc Buck Converters based on Single Current Sensing," 2008 IEEE Power Electronics Specialists Conference, p. 3581-3586 (Saggini).*

European Search Report, Dec. 9, 2014, Dialog Semiconductor GmbH, 14368026.2-1560.

* cited by examiner

OUTPUT CURRENT MONITORING CIRCUIT

1. Technical Field

The present disclosure is directed to current monitoring and in particular output current of a switching regulator to provide more efficient power management.

2. Background

A power management IC (PMIC) is useful in providing precise output monitoring of a switching regulator, wherein a more efficient power management is required, and the average output current is sensed, digitized and used for controlling processors, for example a storage gauge used in battery chargers. In present applications this is accomplished by monitoring a voltage across a precision resistor external to a PMIC. The drawback to the measuring voltage across a precision external resistor entails both cost and power loss. The additional cost comes from the precision resistor and the extra pins necessary to connect to the precision resistor, wherein the precision resistor causes an additional power loss.

U.S. Pat. No. 7,301,288 B2 (Green) is directed to a high speed buck control IC for constant LED current regulation. In U.S. Pat. No. 7,986,188 B2 (Fujiwara) an output current monitor circuit is directed to detection of current flowing through an output transistor. U.S. Pat. No. 8,026,636 B2 (Oh) is directed to an apparatus and method that allows main power supplied from either of two power output including power management integrated circuit (PMIC). U.S. Pat. No. 8,612,779 B2 (More et al.) is directed to a power management integrated circuit (PMIC) and related methods. In U.S. Pat. No. 8,627,119 B2 (Barnes et al.) a power management integrated circuit (PMIC) is directed to methods that have been achieved in support multiple applications. US 2003/0128485 A1 (Matsumoto) is directed to a switching power supply that includes an over current protection circuit. US 2013/0314062 A1 (Notman et al.) is directed to methods and apparatus for control of DC-DC converters. US 2014/0015507 A1 (Park et al.) is directed to an apparatus for supplying power in a mobile terminal.

In the prior art shown in FIG. 1A a precision resistor Rs is connected in a current path in which a current is to be measured as a voltage drop across the precision resistor. The voltage across the resistor is amplified and then connected to a continuous time sigma-delta analog to digital converter (CT-DS ADC), which produces a digital voltage output that is proportional to the current flowing through the precision resistor Rs.

In the prior art shown in FIG. 1B is a block diagram of the voltage mode CT-DS ADC where an integrator connects the amplified voltage across the sense resistor RS to a clocked comparator circuit, and is further connected to clocked logic to produce the continuous time sigma delta voltage signal. Whereas the digital output signal is sufficient to convert the analog current through Rs to a digital signal that can be used in the power management of switching power regulators, the external precision resistor causes extra power loss, extra signal pins and a precision resistor to be used adding to the power, cost and reliability to provide the current monitor.

SUMMARY

It is an objective of the present disclosure to integrate the detection of current by using a replica transistor device to detect the amount of current flowing in an output stage of a buck switching regulator.

It is also an objective of the present disclosure to couple current from the replica transistor device to a current mode CT-DS ADC through an operational transconductor (OTA).

It is further an objective of the present disclosure to provide a separate current output of the OTA for feedback to the replica device and to the current mode CT_SD ADC.

In the preferred embodiment, output current of a buck switching regulator is monitored by coupling an NMOS replica transistor in parallel with the NMOS output transistor device (the replicated transistor) of the switching regulator. A feedback loop of an OTA device is connected to the source terminal of the NMOS replica device, which forces the voltage of the source terminal of the replica device to be at a virtual ground voltage, and therefore forces the same voltage drop across the NMOS replica device as the NMOS device of the buck switching regulator. Since the PMOS output transistor of the buck switching regulator is off when the NMOS replicated output transistor is powered on, the current of the NMOS replicated device flows through the LX node of the buck switching regulator. Since the replica device is effectively coupled in parallel with the NMOS replicated device, all of the current of the NMOS replica device also flows through the LX node of the buck switching regulator. Therefore, the replica NMOS device is a scaled down replica of the NMOS replicated device so as to add only a small portion of the current to the total current flowing through the LX node and the inductor of the buck switching regulator. Assuming variations in device parameters and process defects between the replicated NMOS transistor device of the buck regulator and the NMOS replica device are within permissible limits, the current through the replica device will be proportionally the same as the buck switching regulator output within an acceptable limit.

The OTA has two separate output currents of identical value. One of which is used in a feedback loop connected to the source terminal of the NMOS replica device, and the second output current that connects current to a current mode analog to digital converter, preferably a continuous time-sigma delta analog to digital converter (CT-SD ADC) because of power consumption. The ADC produces an output, which is a digital value of the current flowing through the replica NMOS transistor device. At the input of the OTA and within the feedback loop is a sample and hold circuit comprising a resistor and a capacitor. The switch of the sample and hold circuit is closed when the NMOS transistor of the buck switching regulator is on, and is open when the NMOS transistor is off. The capacitor of the sample and hold circuit is charged during the time that the NMOS transistor is on.

The sample and hold circuitry at the input to the OTA amplifier can cause an error, which is a result of not applying the sample and hold circuit to the current signal of the switching regulator when the PMOS transistor is on and the NMOS transistor is off. This error can be avoided by shorting the input to the OTA amplifier to ground when the NMOS transistor device of the buck switching regulator is off. The error can also be avoided by using both NMOS and PMOS sensing, which adds additional complexity to the input circuitry of the OTA amplifier.

BRIEF DESCRIPTION OF THE DRAWINGS

This invention will be described with reference to the accompanying drawings, wherein.

DETAILED DESCRIPTION

Figure 1A:
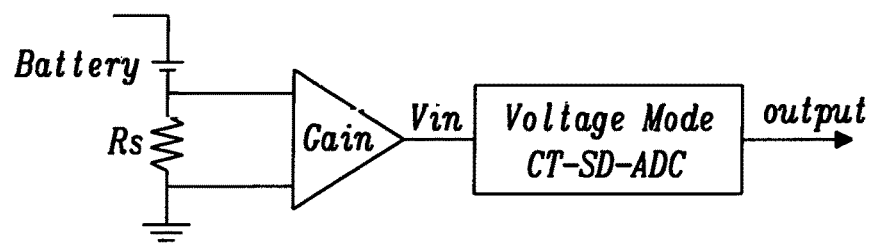
FIG. 1A shows a measurement of a current of prior art, which outputs the current as a digital voltage.
Figure 1B:
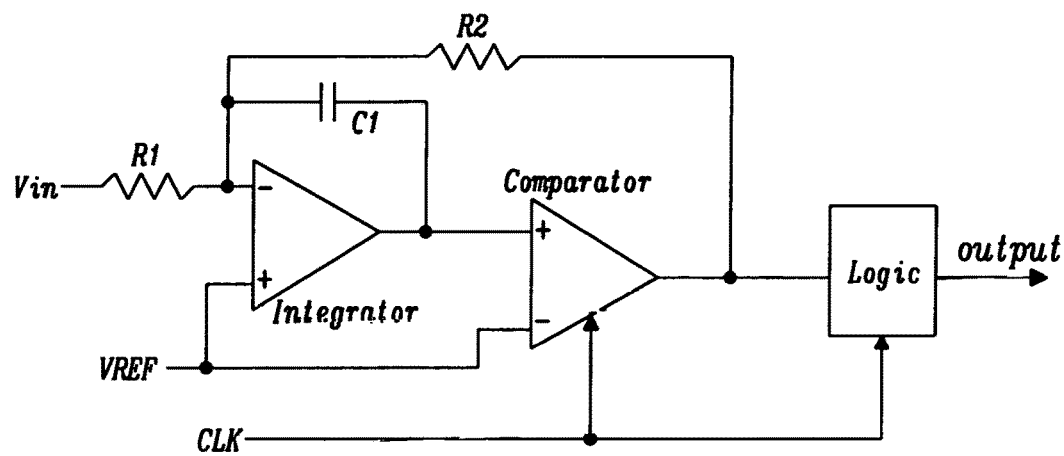
FIG. 1B shows a voltage mode CT-SD ADC of prior art used to convert an analog voltage into a digital output.
Figure 2:
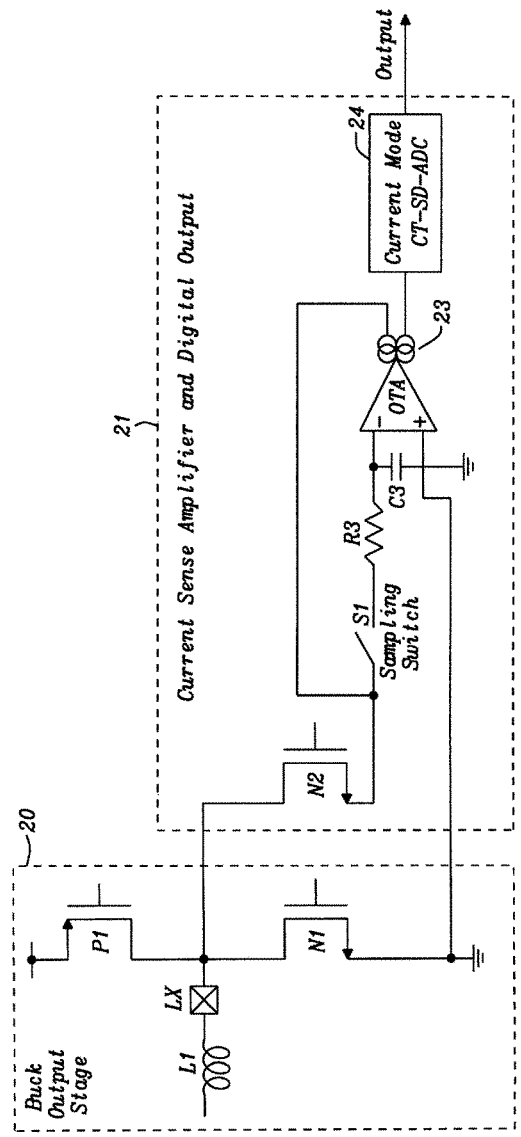
FIG. 2 shows a measurement of the output current of a buck regulator of the present disclosure using a replica of the NMOS output device of the buck regulator.

In FIG. 2 is a diagram of the preferred embodiment of the present disclosure. A partial view of buck switching regulator 20 is shown connected to a current sense amplifier and digital output 21 integrated together on the same integrated circuit device. Within the buck switching regulator is shown the inductor L1, PMOS driver transistor P1 and the NMOS driver transistor N1. Both driver transistors P1 and N1 and the inductor are connected to the LX node. A replica transistor N2 located in the sense and digitizer circuitry 21 is coupled in parallel to a replicated transistor N1 of the buck switching regulator 20, wherein the drain of the replica transistor N2 is connected to the LX node and therefore to the drain of N1. The source of N1 is connected to ground, and source of the replica transistor N2 is forced to a virtual ground by the operational transconductor (OTA). Thus the replica transistor N2 parallels the replicated transistor N1, wherein both transistors have the same drain to source voltage.

The replica transistor N2 is coupled in parallel to the replicated transistor N1 by connecting the drain terminals of the N1 and N2 transistors together and then controlling the source terminal of N2 with the feedback loop of the operational transconductor (OTA) so that the current drawn form the source terminal of N2 produces a voltage equal to zero volts (ground) on the source terminal. A sample and hold circuit comprising resistor R3 and capacitor C3 is connected to the input of the OTA to sample and hold the input signal during the time that the NMOS transistor N1 of the switching regulator is powered on and hold the value of the signal during the time that the NMOS transistor N1 is switched off. Since the charge on the sample and hold circuitry is collected only when the NMOS transistor N1 is powered on, an error in the sampling voltage can occur because the sampling voltage obtained during the on state of the NMOS is not identically the same as when the PMOS is on. It should be noted that using a replica PMOS transistor as well as the NMOS replica transistor N2 could provide a balanced mode that would prevent the error signal noted above.

The current of the replica transistor N2 flows through the LX node and the inductor L1 of the buck switching regulator since the only other possible path is turned off caused by the PMOS transistor P1 being turned off. If the current through the replicated transistor N1 is to be the dominating current, then the current produced by the replica NMOS transistor N2 must be a relatively small portion of the output current of the buck switching regulator that is produced by the NMOS transistor N1. To accomplish this, the replica transistor N2 is a scaled down version of the replicated transistor N1, done in a proportional manner to produce a current in the replica transistor N2 that is proportionally smaller than the current in the replicated transistor N1.

The output of the OTA has two current sources 23 that each produce an identical value of current. One current source is used to drive the feedback loop back to the source terminal of the replica transistor N2. The second current source is used to provide an analog value of the replica transistor current to the ADC for conversion into a digital current value. The ADC shown in FIG. 2 is an integrating type ADC, which is explicitly shown as a continuous time-sigma delta ADC 24. Another integrating type ADC that could be used is an integrating dual slope integral ADC.

Figure 3:
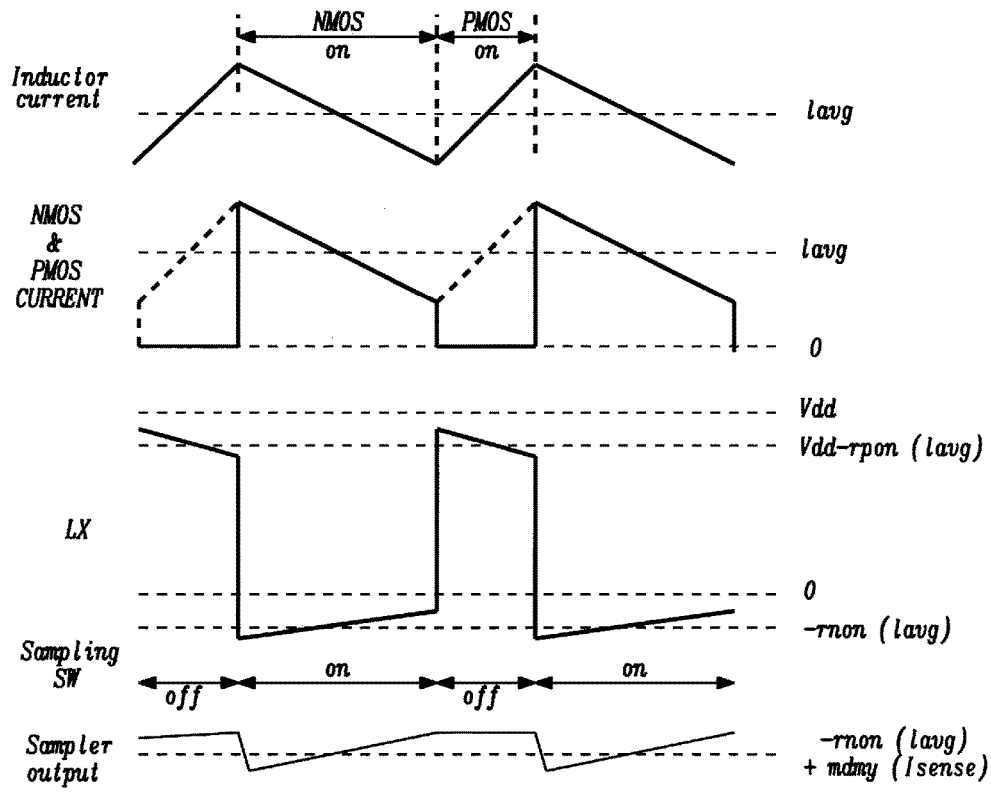
FIG. 3 shows current and voltage waveforms of the buck switching regulator of the present disclosure.

FIG. 3 shows key current and voltage for the buck switching regulator. In the top diagram is shown the inductor current driven by the NMOS and PMOS transistors. In the next diagram is the NMOS and PMOS transistor current with the emphasis being placed on the NMOS current. It should be noted that the NMOS and PMOS transistor are never on at the same time and the average current of both driver transistors, NMOS N1 and PMOS P1 is close to being the same value. The diagram of FIG. 3 also shows the sampling switch S1 to be on only when the NMOS transistor N1 of the buck switching regulator Is turned on.

Figure 4A:
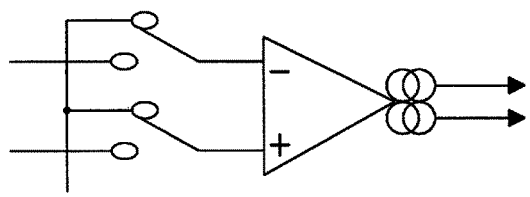
FIGS. 4A and 4b shows the addition of switch settings used to eliminate a sampling signal error when the NMOS device is off.
Figure 4B:
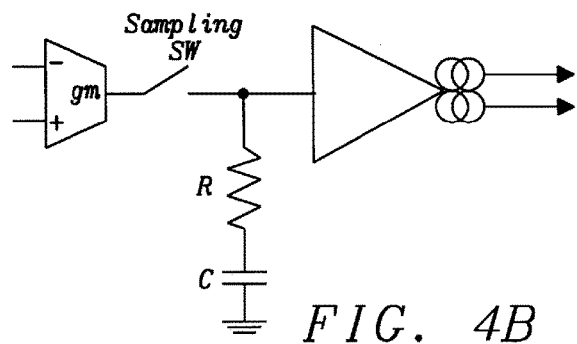

In FIGS. 4A and 4B are shown potential solutions to the hold error which is cause by not using both the NMOS and the PMOS switching signals to charge the hold capacitor. Besides using both the NMOS and the PMOS transistors to charge the hold capacitor, shorting the inputs of the OTA during the time that the NMOS transistor is off as shown in FIG. 4A or disabling the sampling switch during the time that the NMOS transistor is off as shown in FIG. 4b.

While the invention has been particularly shown and described with reference to preferred embodiments thereof, it will be understood by those skilled in the art that various changes in form and details may be made without departing from the spirit and scope of the invention.

What is claimed is:

1. A current monitor, comprising:
a) a transistor, wherein a current flowing through this transistor is to be monitored and wherein this transistor is replicated by a replica transistor;
b) said replica transistor, which is a scaled down version of the replicated transistor, wherein a drain of the replica transistor is connected to a drain of the replicated transistor;
c) a sample and hold circuit, comprising a sampling switch, a resistor and a capacitor, is connected to a first input of an operational transconductor, wherein the sample and hold circuit is configured to sample and hold input signals from a source of the replica transistor during the time that the replicated transistor is powered on and hold the value of the input signals during the time that the replicated transistor is switched off, wherein a first terminal of the sampling switch is connected to a source of the replica transistor, a second terminal of the sampling switch is connected to a first terminal of the resistor, a second terminal of the resistor is connected to a first terminal of the capacitor and to the first input of the operational transconductor and a second terminal of the capacitor is connected to ground;
d) said operational transconductor (OTA) having two inputs and two current outputs, wherein the first input of said OTA is connected via the sample and hold circuit to a source of the replica transistor and wherein a second input of said OTA is connected to a source of the replicated transistor, wherein each output of the OTA is coupled to one of two current sources, wherein the first current source is configured to drive a feedback loop to the source of the replica transistor and the second current source is configured to provide an analog value of the replica transistor current to a current mode integrating analog to digital converter for conversion into a digital current value;

e) said current mode integrating analog to digital converter (ADC) configured to provide a digital output of the current monitor; and f) wherein said replicated transistor is configured to produce the current to be monitored, wherein said OTA is configured to control a source current of the replica transistor to be of a proportional current value as a source current of the replicated transistor while said OTA is configured to produce an output current equivalent to the source current of the replicated transistors.

2. The current monitor of claim 1, wherein said replicated transistor plus said replica transistor are capable of producing a total current flowing through an inductor of a switching regulator during an on state of an NMOS driver transistor.

3. The current monitor of claim 2, wherein the replica transistor is capable of being controlled by the OTA to produce a voltage drop across the replica transistor which is equivalent to the voltage drop across the replicated transistor.

4. The current monitor of claim 1, wherein said replica transistor is capable of being sized to produce a reduced current proportional to the replicated transistor at a same drain to source voltage.

5. The current monitor of claim 1, wherein the replica transistor is a device constructed on a same integrated circuit as the replicated transistor and comprising the same characteristics as the replicated transistor.

6. The current monitor of claim 1, wherein the OTA is capable of controlling the source voltage of the replica transistor to a virtual ground voltage to produce the same value of current as the replicated transistor.

7. The current monitor of claim 6, wherein the OTA is capable of producing a proportionally reduced current from the replica transistor, wherein the replica transistor is a scaled down replica transistor by controlling the source voltage of the replica transistor to the virtual ground voltage.

8. The current monitor of claim 1, wherein the current mode integrating type ADC is a continuous time-sigma delta ADC (CT-SD ADC).

9. The current monitor of claim 1, wherein the current mode integrating type ADC is a dual slope integral ADC.

10. The current monitor of claim 1, wherein a sample switch, a resistor and a capacitor are configured to sample information of the average current flowing through the replicated transistor while the replicated transistor is ON and to hold the current information during the time the replicated transistor is OFF, wherein the sample switch and the resistor are connected in series with a first input of the OTA and the capacitor is connected between the first input of the OTA and ground, wherein the second input of the OTA is connected to ground and to the source of the replicated transistor and wherein the sample switch is only ON while the replicated transistor is ON.

11. The current monitor of claim 1, wherein the replicated transistor and the replica transistor are both NMOS transistors.

12. The current monitor of claim 1, wherein the replicated transistor and the replica transistor are both PMOS transistors.

13. A method of monitoring output current of a switching regulator, comprising;

a) forming a scaled down replica transistor wherein a drain of the replica transistor is coupled to a replicated output transistor of a switching regulator;

b) sampling and holding output signals of the replica transistor during the time the replicated transistor is ON, holding the value of the signals during the time the replicated transistor is OFF and provide then the signals to an input of an operational transconductor;

c) controlling said replica transistor with the operational transconductor (OTA) to produce a proportional current value in said replica transistor as in the replicated transistor; and d) producing an output current from the OTA and coupling the output current to a current mode continuous time integrating analog to digital converter (ADC) for digital readout of the replicated current.

14. The method of claim 13, wherein said switching regulator is a buck switching regulator.

15. The method of claim 13, wherein said replica transistor is integrated on a same integrated circuit device as the replicated transistor and has a same characteristic as the replicated transistor.

16. The method of claim 13, wherein said replica transistor and the replicated transistor are connected by drain terminals of each transistor.

17. The method of claim 13, wherein said OTA controls the replica transistor source current to produce a proportional value of source current of the replicated transistor by controlling the source terminal voltage of the replica transistor to be at a virtual ground voltage.

18. The method of claim 13, wherein said OTA produces two identical output currents, wherein a first output current is used for feedback and a second output current is used to connect to an ADC.

19. The method of claim 13, wherein the current mode continuous time integrating type ADC is a continuous time-sigma delta ADC (CT-SD ADC).

20. The method of claim 13, wherein the current mode integrating type ADC is a dual slope integral ADC.

21. The method of claim 13, wherein the replicated transistor and the replica transistor combine to produce a total current flowing through an inductor of a switching regulator.

22. The method of claim 13, wherein a sample switch, a resistor and a capacitor are configured to sample information of the average current flowing through the replicated transistor while the replicated transistor is ON and to hold the current information during the time the replicated transistor is OFF, wherein the sample switch and the resistor are connected in series with a first input of the OTA and the capacitor is connected between the first input of the OTA and ground, wherein the second input of the OTA is connected to ground and to the source of the replicated transistor and wherein the sample switch is only ON while the replicated transistor is ON.

23. The method of claim 13, wherein the replicated transistor and the replica transistor are both NMOS transistors.

24. The method of claim 13, wherein the replicated transistor and the replica transistor are both PMOS transistors.

* * * * *